United States Patent
Xu et al.

(10) Patent No.: US 8,692,697 B2
(45) Date of Patent: Apr. 8, 2014

(54) METHOD AND APPARATUS FOR ENCODING BASED ON A LINEAR BLOCK CODE

(75) Inventors: Ying Xu, Plano, TX (US); Shaofang Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 225 days.

(21) Appl. No.: 13/303,979

(22) Filed: Nov. 23, 2011

(65) Prior Publication Data

US 2012/0068864 A1 Mar. 22, 2012

Related U.S. Application Data

(63) Continuation of application No. PCT/CN2009/071947, filed on May 25, 2009.

(51) Int. Cl.
*H03M 13/00* (2006.01)

(52) U.S. Cl.
USPC .............................. 341/94; 341/50

(58) Field of Classification Search
USPC .............. 341/94, 50; 714/752, 716, 755, 776, 714/777, 781, 804; 375/295; 370/203, 329
See application file for complete search history.

(56) References Cited

U.S. PATENT DOCUMENTS

| | | | |
|---|---|---|---|
| 5,600,659 | A | 2/1997 | Chen |
| 6,882,636 | B1 | 4/2005 | Kim et al. |
| 7,969,332 | B2 * | 6/2011 | Xu et al. .................... 341/50 |
| 2008/0270867 | A1 | 10/2008 | Chung et al. |
| 2009/0028190 | A1 | 1/2009 | Yu |

FOREIGN PATENT DOCUMENTS

| | | |
|---|---|---|
| CN | 101414833 A | 4/2009 |
| WO | WO 2009064122 A1 | 5/2009 |

OTHER PUBLICATIONS

International Search Report and Written Opinion of the International Searching Authority issued in corresponding PCT Patent Application No. PCT/CN2009/071947, mailed Feb. 25, 2010.
Extended European Search Report issued in corresponding European Patent Application No. 09799479.2, mailed Oct. 20, 2011.
Notice of Allowance issued in commonly owned U.S. Appl. No. 12/685,390, mailed Feb. 23, 2011.
LTE, "3$^{rd}$ Generation Partnership Project; Technical Specification Group Radio Access Network; Evolved Universal Terrestrial Radio Access (E-UTRA); Multiplexing and Channel Coding" (Release 8) 3GPP TS 36.212, V8.6.0, Mar. 2009.
LG Electronics, "Coding for CQI Moved from PUCCH to PUSCH" Agenda 6.1.4, 3GPP TSG RAN WG1 #52. Sorrento, Italy, Feb. 11-15, 2008. R1-081098.
Texas Instructions, "CQI Coding in PUCCH and PUSCH" Agenda 7.1.2, 3GPP TSG RAN WG1 #53, Kansas City, MO, USA. May 5-9, 2008. R1-081990.

(Continued)

*Primary Examiner* — Joseph Lauture
(74) *Attorney, Agent, or Firm* — Brinks Gilson & Lione

(57) ABSTRACT

A method and apparatus for encoding based on a linear block code, and a method and apparatus for generating a linear block code are provided. The method for encoding based on a linear block code includes: generating a linear block code; and encoding an information sequence with an encoding matrix of the linear block code to obtain a bit stream sequence. The linear block codes have a good minimum distance characteristic, so that the error correction performance is improved.

8 Claims, 4 Drawing Sheets

(56) References Cited

OTHER PUBLICATIONS

Marvell, "Variable-Length Block Code for CQI Report on PUSCH" Agenda Item 6.2, 3GPP TSG RAN WG1 #52bis, Shenzhen, Mar. 31-Apr. 4, 2008. R1-081271.

Xu et al., "On the Super Codes of the First Order Reed-Muller Code Based on m-Sequence Pairs" IEEE 2011.

Samsung, "Harmonization Impact on TFCI and New Optimal Coding for Extended TFCI with Almost No Complexity Increase" TSG-RAN Working Group 1 Meeting #5, Helsinki, Finland, Jul. 13-16, 1999. TSGR(99)913.

Chinese Patent No. 102077470, issued on Feb. 27, 2013, granted in corresponding Chinese Patent Application No. 200980123741.6.

* cited by examiner

METHOD AND APPARATUS FOR ENCODING BASED ON A LINEAR BLOCK CODE

CROSS-REFERENCE TO RELATED APPLICATION

This application is a continuation of International Application No. PCT/CN2009/071947, filed on May 25, 2009, which is hereby incorporated by reference in its entirety. This application is related to U.S. application Ser. No. 12/685,390, filed Jan. 11, 2010 and now U.S. Pat. No. 7,969,332, which is also incorporated herein by reference.

FIELD

The present disclosure relates to telecommunication fields, and in particular, to a method and apparatus for encoding based on a linear block code, and a method and apparatus for generating a linear block code.

BACKGROUND

In a telecommunication system, linear block codes are usually employed to encode control information with a small length, such as Transport Format Combination Index (TFCI) encoding in a Wideband Code Division Multiple Access (WCDMA) system, Physical Uplink Control Channel (PUCCH) and Physical Uplink Shared Channel (PUSCH) encoding in a Long Term Evolution (LTE) system. For linear block codes with a small length, the minimum code distance is a direct factor that impacts the error correction performance. Therefore, when linear block codes are designed, the minimum code distance is usually made as long as possible.

In the LTE system, a (32, 11) linear block code is employed to PUSCH encoding. The encoding matrix of the (32, 11) linear block code has 32 rows and 11 columns. Minimum code distances under different information bit lengths are described in Table 1.

TABLE 1

Mapping between minimum distances of the (32, 11) linear block code and information bit lengths

| | Information Bit Length | | | | | | | | | | |
|---|---|---|---|---|---|---|---|---|---|---|---|
| | 1 | 2 | 3 | 4 | 5 | 6 | 7 | 8 | 9 | 10 | 11 |
| Minimum Distance | 32 | 16 | 16 | 16 | 16 | 16 | 12 | 12 | 12 | 12 | 10 |

The (32,11) linear block code supports encoding with an information bit length smaller than or equal to 11 and the distance of an obtained code word is smaller than or equal to 32.

The (32,11) linear block code supports encoding with an information bit length smaller than or equal to 11 and the distance of an obtained code word is smaller than or equal to 32. However, the minimum code distance is small, which will impact the error correction performance of the encoding system.

SUMMARY

Aspects of the present disclosure provide methods and apparatuses for encoding based on linear block codes and methods and apparatuses for generating linear block codes, so as to obtain linear block codes with a better error correction performance.

According to one aspect of the present disclosure, a method for encoding based on a linear block code includes:

generating a linear block code; and encoding an information sequence with an encoding matrix of the linear block code to obtain a bit stream sequence; wherein the encoding matrix of the linear block code is:

$$\begin{bmatrix} 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 \\ 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 \\ 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 \\ 0 & 0 & 0 & 0 & 0 & 0 & 0 & 0 & 1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 \\ 0 & 0 & 0 & 0 & 0 & 0 & 0 & 0 & 0 & 0 & 0 & 0 & 0 & 0 & 0 & 0 & 1 & 1 & 1 & 1 & 1 & 1 & 1 & 1 & 1 & 1 & 1 & 1 & 1 & 1 & 1 & 1 \\ 0 & 1 & 0 & 0 & 0 & 1 & 1 & 1 & 0 & 0 & 1 & 0 & 0 & 0 & 0 & 1 & 0 & 1 & 1 & 1 & 1 & 0 & 1 & 1 & 0 & 0 & 0 & 1 & 1 & 1 & 0 & 1 \\ 0 & 0 & 1 & 1 & 0 & 1 & 1 & 0 & 0 & 1 & 0 & 1 & 1 & 1 & 1 & 0 & 1 & 1 & 0 & 0 & 0 & 1 & 1 & 0 & 0 & 0 & 0 & 1 & 0 & 1 & 0 \\ 0 & 0 & 0 & 0 & 1 & 1 & 0 & 0 & 0 & 1 & 0 & 1 & 1 & 0 & 0 & 1 & 0 & 1 & 0 & 1 & 1 & 0 & 0 & 1 & 1 & 1 & 1 & 1 & 0 & 0 & 1 & 1 \\ 0 & 0 & 0 & 1 & 0 & 0 & 0 & 1 & 1 & 0 & 1 & 1 & 0 & 1 & 0 & 0 & 0 & 1 & 1 & 1 & 0 & 1 & 1 & 1 & 1 & 1 & 0 & 1 & 0 & 0 & 1 & 0 \\ 0 & 0 & 0 & 1 & 0 & 1 & 0 & 0 & 0 & 1 & 1 & 1 & 1 & 0 & 0 & 1 & 0 & 1 & 0 & 1 & 1 & 1 & 0 & 0 & 1 & 0 & 0 & 0 & 1 & 1 & 1 & 1 & 1 & 0 & 1 \end{bmatrix}$$

According to another aspect of the present disclosure, a method for generating a linear block code includes: generating all first sequence sand second sequences according to a first function and a second function, respectively; displacing rows of a matrix made up of the first sequences and rows of a matrix made up of the second sequences, respectively, to obtain a matrix made up of third sequences and a matrix made up of fourth sequences; choosing multiple fifth sequences of linear independence from the matrix made up of the third sequences and choosing multiple sixth sequences of linear independence from the matrix made up of the fourth sequences; permuting columns of the matrix made up of the fifth sequences and columns of the matrix made up of the sixth sequences to obtain a matrix made up of seventh sequences and a matrix made up of eighth sequences; and obtaining an encoding matrix of a linear block code according to the matrix made up of the seventh sequences and the matrix made up of the eighth sequences, wherein the encoding matrix of linear block codes is used for encoding an information sequence.

According to further another aspect of the present disclosure, an apparatus for encoding based on a linear block code includes a generating unit and an encoding unit.

The generating unit is configured to generate a linear block code; and the encoding unit is configured to encode an information sequence with an encoding matrix of the linear block code to obtain a bit stream sequence; wherein the encoding matrix of the linear block code is:

$$\begin{bmatrix}
1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\
0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 \\
0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 \\
0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 \\
0 & 0 & 0 & 0 & 0 & 0 & 0 & 0 & 1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 \\
0 & 0 & 0 & 0 & 0 & 0 & 0 & 0 & 0 & 0 & 0 & 0 & 0 & 0 & 0 & 0 & 1 & 1 & 1 & 1 & 1 & 1 & 1 & 1 & 1 & 1 & 1 & 1 & 1 & 1 & 1 & 1 \\
0 & 1 & 0 & 0 & 0 & 1 & 1 & 1 & 0 & 0 & 1 & 0 & 0 & 0 & 0 & 1 & 0 & 1 & 1 & 1 & 1 & 0 & 1 & 1 & 0 & 0 & 0 & 1 & 1 & 1 & 0 & 1 \\
0 & 0 & 1 & 1 & 0 & 1 & 1 & 0 & 0 & 1 & 0 & 1 & 1 & 1 & 1 & 0 & 1 & 1 & 0 & 0 & 0 & 1 & 1 & 0 & 0 & 0 & 0 & 1 & 0 & 1 & 0 \\
0 & 0 & 0 & 0 & 1 & 1 & 0 & 0 & 0 & 1 & 0 & 1 & 1 & 0 & 0 & 1 & 0 & 1 & 0 & 1 & 1 & 0 & 0 & 1 & 1 & 1 & 1 & 1 & 0 & 0 & 1 & 1 \\
0 & 0 & 0 & 1 & 0 & 0 & 0 & 1 & 1 & 0 & 1 & 1 & 0 & 1 & 0 & 0 & 0 & 1 & 1 & 1 & 0 & 1 & 1 & 1 & 1 & 0 & 1 & 0 & 0 & 1 & 0 \\
0 & 0 & 0 & 1 & 0 & 1 & 0 & 0 & 0 & 1 & 1 & 1 & 0 & 0 & 1 & 0 & 1 & 1 & 1 & 0 & 0 & 1 & 0 & 0 & 0 & 1 & 1 & 1 & 1 & 1 & 0 & 1
\end{bmatrix}$$

According to further another aspect of the present disclosure, an apparatus for generating a linear block code includes: a generating unit, a displacement processing unit, a choosing unit, a permutation processing unit, and an obtaining unit.

The generating unit is configured to generate all first sequences second sequences according to a first function and a second function, respectively. The displacement processing unit is configured to displace rows of a matrix made up of the first sequences and rows of a matrix made up of the second sequences to obtain a matrix made up of third sequences and a matrix made up of fourth sequences. The choosing unit is configured to choose multiple fifth sequences of linear independence from the matrix made up of the third sequences and multiple sixth sequences of linear independence from the matrix made up of the fourth sequences. The permutation processing unit is configured to permute columns of a matrix made up of the fifth sequences and columns of a matrix made up of the sixth sequences to obtain a matrix made up of seventh sequences and a matrix made up of eighth sequences. And the obtaining unit is configured to obtain an encoding matrix of a linear block code according to the matrix made up of the seventh sequences and the matrix made up of the eighth sequences, wherein the encoding matrix of linear block codes is used for encoding an information sequence.

According to aspects of the present disclosure, the linear block codes generated have a good minimum distance characteristic so that the error correction performance of the encoding system is improved.

DETAILED DESCRIPTION

Figure 1:
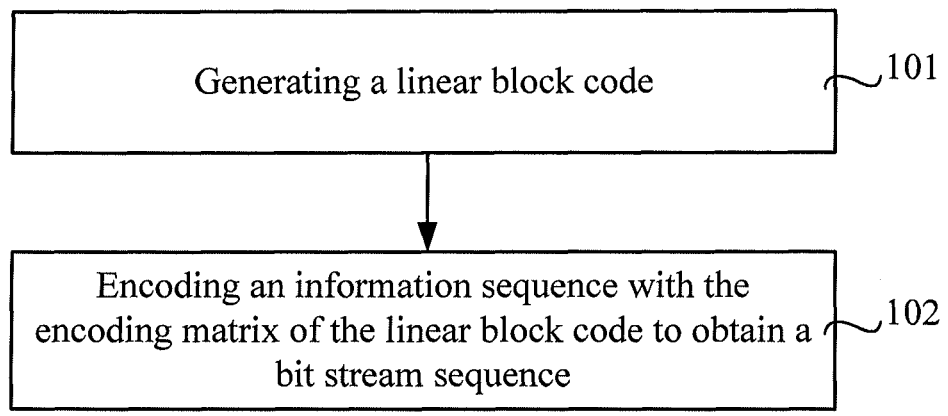
FIG. 1 shows a flowchart of a method for encoding based on a linear block code according to one embodiment of the present disclosure.

FIG. 1 shows a flowchart of a method for encoding based on a linear block code according to one embodiment of the present disclosure. As shown in FIG. 1, the method may include the following steps:

Step 101: Generating a linear block code.

For example, an encoding matrix of the generated linear block codes is as follows:

$$\begin{bmatrix}
1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\
0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 \\
0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 \\
0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 \\
0 & 0 & 0 & 0 & 0 & 0 & 0 & 0 & 1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 \\
0 & 0 & 0 & 0 & 0 & 0 & 0 & 0 & 0 & 0 & 0 & 0 & 0 & 0 & 0 & 0 & 1 & 1 & 1 & 1 & 1 & 1 & 1 & 1 & 1 & 1 & 1 & 1 & 1 & 1 & 1 & 1 \\
0 & 1 & 0 & 0 & 0 & 1 & 1 & 1 & 0 & 0 & 1 & 0 & 0 & 0 & 0 & 1 & 0 & 1 & 1 & 1 & 1 & 0 & 1 & 1 & 0 & 0 & 0 & 1 & 1 & 1 & 0 & 1 \\
0 & 0 & 1 & 1 & 0 & 1 & 1 & 0 & 0 & 1 & 0 & 1 & 1 & 1 & 1 & 0 & 1 & 1 & 0 & 0 & 0 & 1 & 1 & 0 & 0 & 0 & 0 & 1 & 0 & 1 & 0 \\
0 & 0 & 0 & 0 & 1 & 1 & 0 & 0 & 0 & 1 & 0 & 1 & 1 & 0 & 0 & 1 & 0 & 1 & 0 & 1 & 1 & 0 & 0 & 1 & 1 & 1 & 1 & 1 & 0 & 0 & 1 & 1 \\
0 & 0 & 0 & 1 & 0 & 0 & 0 & 1 & 1 & 0 & 1 & 1 & 0 & 1 & 0 & 0 & 0 & 1 & 1 & 1 & 0 & 1 & 1 & 1 & 1 & 0 & 1 & 0 & 0 & 1 & 0 \\
0 & 0 & 0 & 1 & 0 & 1 & 0 & 0 & 0 & 1 & 1 & 1 & 0 & 0 & 1 & 0 & 1 & 1 & 1 & 0 & 0 & 1 & 0 & 0 & 0 & 1 & 1 & 1 & 1 & 1 & 0 & 1
\end{bmatrix}$$

Step 102: Encoding an information sequence with the above encoding matrix of the linear block code to obtain a bit stream sequence.

Further, in step 102, the bit stream sequence may be obtained according to the following formula:

$$b(t) = \left[\sum_{i=1}^{K}(o(i) \cdot x_i(t))\right] \bmod 2 \quad (1)$$

In the formula, $x_i(t)$ is the sequence of the encoding matrix of the linear block code. In the above encoding matrix, each row may be regarded as a sequence, where i is the row number and t is the column number, and $1 \leq i \leq K$, $1 \leq t \leq N$. K is the number of sequences in the encoding matrix and N is the length of a sequence in the encoding matrix. The value ranges of K and N are $1 \leq K \leq 2n+1$, $1 \leq N \leq 2^n$, K is smaller than N, and n is a positive integer larger than or equal to 3. o(i) is the information sequence, the length of which is K; b(t) is the bit stream sequence, the length of which is N. With respect to the encoding matrix generated in step 101, K=11 and N=32.

In the embodiment, K sequences of a linear block code with length of N are used to encode an information sequence with length of K to obtain a bit stream sequence with length of N. Minimum code distances of the above encoding matrix under different information sequence lengths are provided in Table 2.

TABLE 2

Mapping between minimum code distances of the encoding matrix and information sequence lengths in the embodiment of the present disclosure

| | Information Bit(s) Length | | | | | | | | | | |
|---|---|---|---|---|---|---|---|---|---|---|---|
| | 1 | 2 | 3 | 4 | 5 | 6 | 7 | 8 | 9 | 10 | 11 |
| Minimum Distance | 32 | 16 | 16 | 16 | 16 | 16 | 12 | 12 | 12 | 12 | 12 |

Comparison between Table 2 and Table 1 shows that, when the information sequence length is 11, the minimum distance in Table 2 is 12, larger than 10 in Table 1. This means, the encoding matrix in the embodiment improves the error correction performance of the encoding system.

The technical solution for generating a linear block code is detailed described through the following embodiments.

Figure 2:
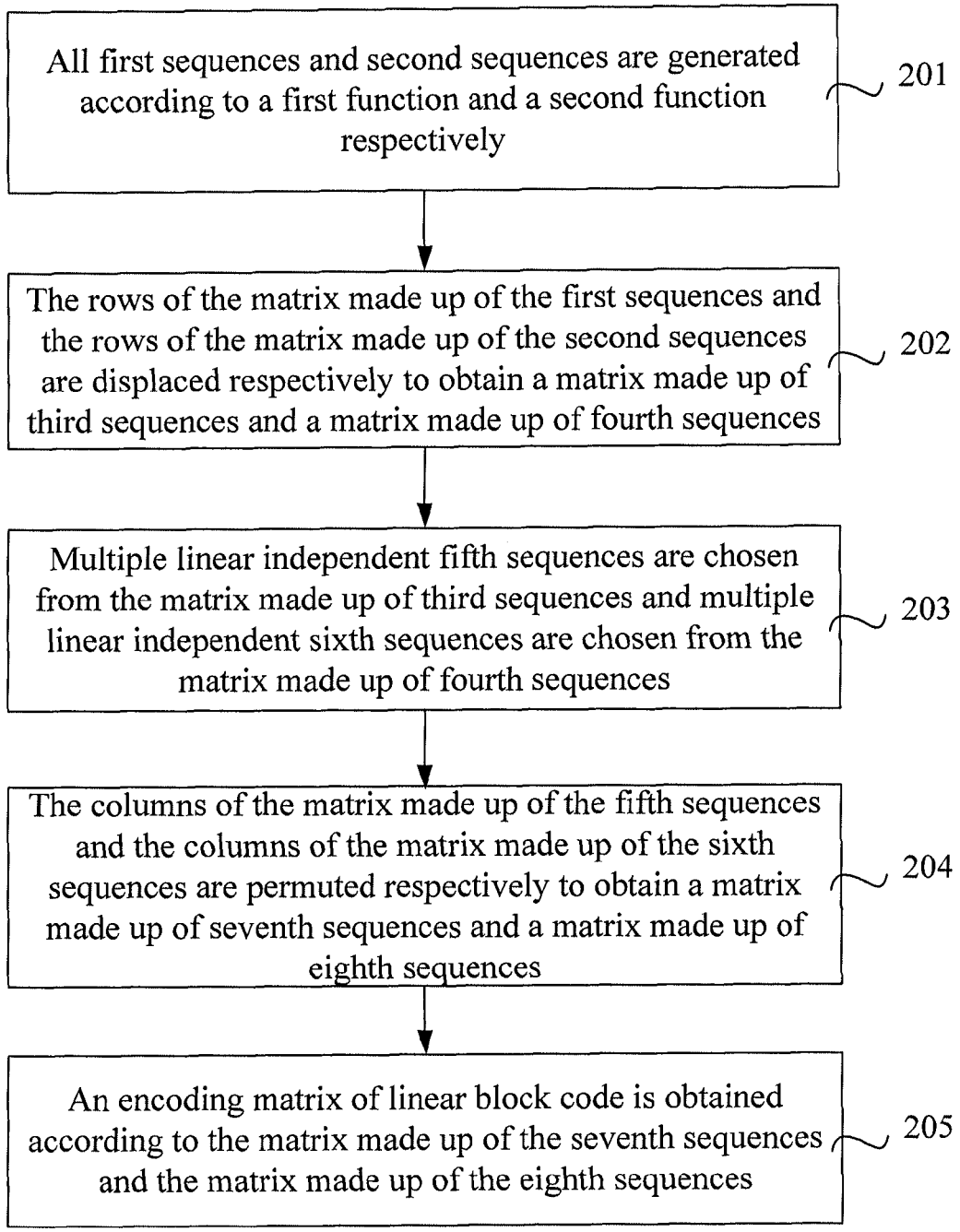
FIG. 2 shows a flowchart of a method for generating a linear block code according to another embodiment of the present disclosure.

FIG. 2 shows a flowchart of a method for generating a linear block code according to another embodiment of the present disclosure. As shown in FIG. 2, the method may include the following steps:

Step 201: All first sequences and second sequences are generated according to a first function and a second function, respectively.

Step 202: The rows of the matrix made up of the first sequences and the rows of the matrix made up of the second sequences are displaced, respectively, to obtain a matrix made up of third sequences and a matrix made up of fourth sequences.

Step 203: Multiple fifth sequences of linear independence are chosen from the matrix made up of third sequences and multiple sixth sequences of linear independence are chosen from the matrix made up of fourth sequences.

Step 204: The columns of the matrix made up of the fifth sequences and the columns of the matrix made up of the sixth sequences are permuted, respectively, to obtain a matrix made up of seventh sequences and a matrix made up of eighth sequences.

Step 205: An encoding matrix of linear block code is obtained according to the matrix made up of the seventh sequences and the matrix made up of the eighth sequences.

The embodiment provides a method for generating a linear block code, which can be used in a radio telecommunication system. With the method provided in the embodiment, any linear block code corresponding to any length of information sequences can be generated, so that the radio telecommunication system is able to encode information sequences with any length to obtain a bit stream sequence. Moreover, the minimum distance of the linear block codes generated according to the method in the embodiment is better than that of the prior art, so that the error correction performance of the encoding system is improved and the complexity of encoding is reduced.

Figure 3:
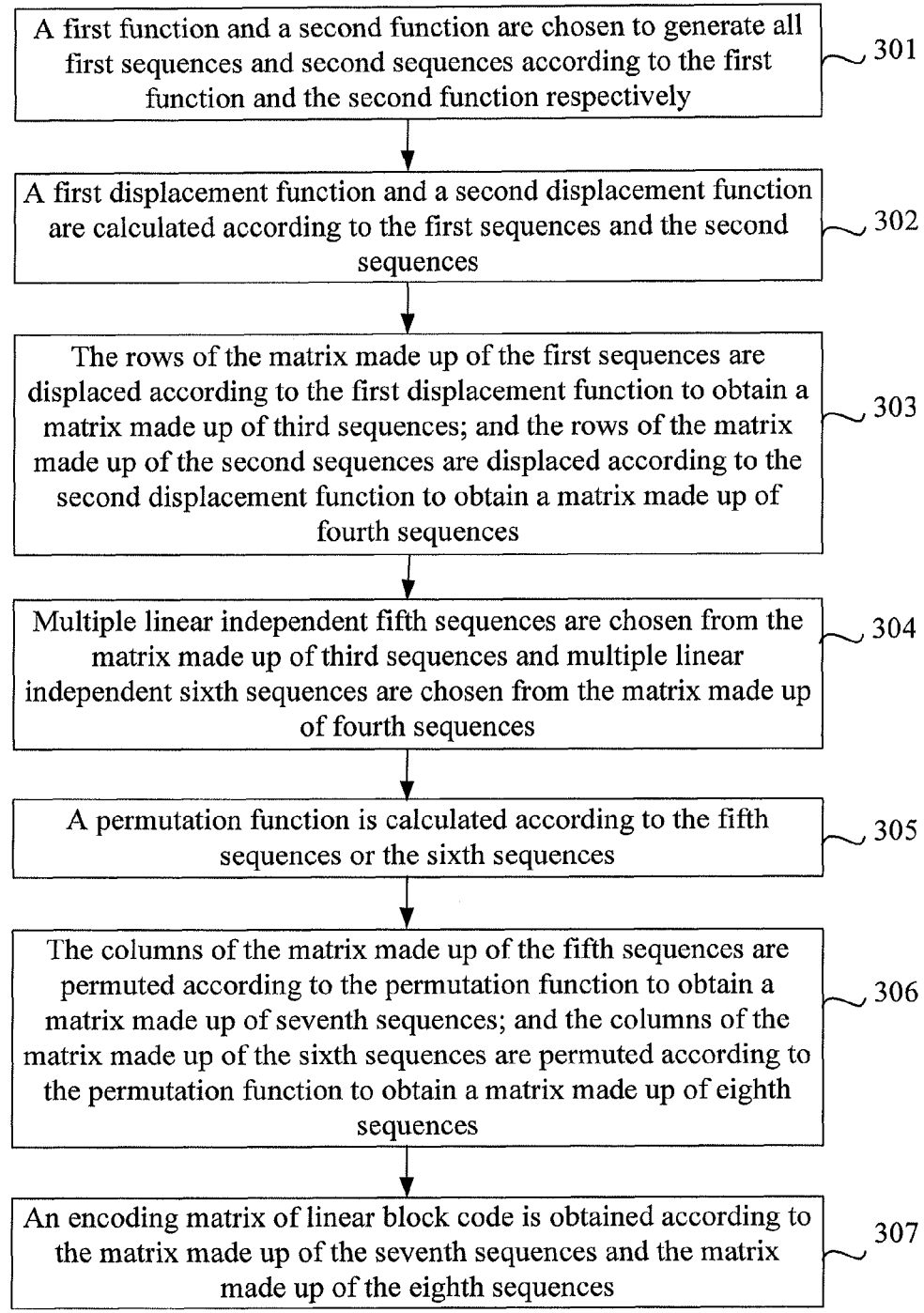
FIG. 3 shows a flowchart of a method for generating a linear block code according to further another embodiment of the present disclosure.

FIG. 3 shows a flowchart of a method for generating a linear block code according to further another embodiment of the present disclosure. This embodiment provides a method for generating K sequences of a linear block code with length of N, where the value ranges of K and N are $1 \leq K \leq 2n+1$, $1 \leq N \leq 2^n$, K is smaller than N, and n is a positive integer larger than or equal to 3.

As shown in FIG. 3, the method may include the following steps:

Step 301: A first function and a second function are chosen to generate all first sequences and second sequences according to the first function and the second function, respectively.

Suppose the first function is $f_1(x)$ and the second function is $f_2(x)$. $f_1(x)$ and $f_2(x)$ may be generating functions of n-order m-sequences. The m-sequences generated by the two functions may constitute an m-sequence pair.

Suppose $2^n-1$ m-sequences generated according to $f_1(x)$ are $m_i(t)$, i.e., the first sequences, where $1 \leq t \leq 2^n-1$, $1 \leq i \leq 2^n-1$. The $2^n-1$ m-sequences satisfy a relationship of cyclic displacement. Suppose $2^n-1$ different m-sequences generated according to $f_2(x)$ are $l_i(t)$, i.e., the second sequences, where $1 \leq t \leq 2^n-1$, $1 \leq i \leq 2^n-1$.

Optionally, the m-sequences generated by the first function and the second function may not constitute a m-sequence pair. A person skilled in the art would know that, if generated m-sequences constitute an m-sequence pair, the minimum distance of the obtained linear block codes would be better.

Step 302: A first displacement function and a second displacement function are calculated according to the first sequences and the second sequences.

Suppose the first displacement function is $C_1(i)$ and the second displacement function is $Q_1(i)$, the $C_1(i)$ and $Q_1(i)$ can be obtained according to the following two formulas:

$$C_1(i) = \sum_{t=1}^{n} m_i(t) \times 2^{n-t} \quad (2)$$

$$Q_i(i) = \sum_{t=1}^{n} l_i(t) \times 2^{n-t} \quad (3)$$

Step 303: The rows of the matrix made up of the first sequences are displaced according to the first displacement function to obtain a matrix made up of third sequences; and the rows of the matrix made up of the second sequences are displaced according to the second displacement function to obtain a matrix made up of fourth sequences.

Suppose the third sequence is $m'_i(t)$, and then:

$$m'_{C_1(i)}(t) = m_i(t) \quad (4)$$

Suppose the fourth sequence be $l'_i(t)$, and then:

$$l'_{Q_1(i)}(t) = l_i(t) \quad (5)$$

The formulas (4) and (5) means that, the $i^{th}$ row of the matrix made up of first sequences is displaced to row $C_1(i)$ to obtain a matrix made up of third sequences; and the $i^{th}$ row of the matrix made up of second sequences is displaced to row $Q_1(i)$ to obtain a matrix made up of fourth sequences.

Step 304: Multiple fifth sequences of linear independence are chosen from the matrix made up of third sequences and multiple sixth sequences of linear independence are chosen from the matrix made up of fourth sequences.

For example, n fifth sequences of linear independence, denoted by $w'_i(t)$, are chosen from the matrix made up of $m'_i(t)$, i.e., $w'_1(t)=m'_{i\_1}(t)$, $w'_2(t)=m'_{i\_2}(t)$, ..., $w'_n(t)=m'_{i\_n}(t)$.

N sixth sequences of linear independence, denoted by $y'_i(t)$, are chosen from the matrix made up of $l'_i(t)$. The positions of the sixth sequences in the matrix made up of $l'_i(t)$ are the same as the positions of the fifth sequences in the matrix made up of $m'_i(t)$, i.e., $y'_1(t)=l'_{i\_1}(t)$, $y'_2(t)=l'_{i\_2}(t)$, ..., $y'_n(t)=l'_{i\_n}(t)$.

Step 305: A permutation function is calculated according to the fifth sequences or the sixth sequences.

If the permutation function is calculated according to the fifth sequences, the permutation function is supposed to be $C_2(t)$, and then:

$$C_2(t) = \sum_{i=1}^{n} w'_i(t) \times 2^{i-1} \quad (6)$$

If the permutation function is calculated according to the sixth sequences, the permutation function is supposed to be $C_3(t)$, and then:

$$C_3(t) = \sum_{i=1}^{n} l'_i(t) \times 2^{i-1} \quad (7)$$

Step 306: The columns of the matrix made up of the fifth sequences are permuted according to the permutation function to obtain a matrix made up of seventh sequences; and the columns of the matrix made up of the sixth sequences are permuted according to the permutation function to obtain a matrix made up of eighth sequences.

Suppose the seventh sequence is $w_i(t)$, and then:

$$w_i(C(t)) = w'_i(t) \quad (8)$$

Suppose the eighth sequences is $l_i(t)$, and then:

$$l_i(C(t)) = l'_i(t) \quad (9)$$

where, $C(t)$ may be $C_2(t)$ or $C_3(t)$.

This means the $t^{th}$ column of the matrix made up of fifth sequences is permuted to column $C(t)$ to obtain a matrix made up of seventh sequences; and the $t^{th}$ column of the matrix made up of sixth sequences is permuted to column $C(t)$ to obtain a matrix made up of eighth sequences.

Step 307: An encoding matrix of linear block code is obtained according to the matrix made up of the seventh sequences and the matrix made up of the eighth sequences.

For example, add a "0" before each sequence of the seventh and the eighth sequences to obtain 2n sequences with length of $2^n$. Then add an all-1 sequence with length of $2^n$ to obtain 2n+1 sequences with length of $2^n$. These sequences make up the encoding matrix of linear block code. Suppose the sequences in the encoding matrix are $x_i(t)$, $1 \leq i \leq K$, $1 \leq t \leq N$, where $1 \leq K \leq 2n+1$, $1 \leq N \leq 2^n$, K is smaller than N, and n is a positive integer larger than or equal to 3.

According to the linear block codes generated according to the embodiment, where $N=2^n$, the minimum code distances under different information sequence lengths are provided in Table 3.

TABLE 3

Mapping between minimum code distances of the encoding matrix and information sequence lengths in the third embodiment

| Information Bit(s) Length | 1 | 2 to n + 1 | n + 2 to 2n + 1 |
|---|---|---|---|
| Minimum Distance | $2^n$ | $2^{n-1}$ | $(2^{n-1} - 2^{\lfloor(n+2)/2\rfloor-1})$ |

As shown in Table 3, if the information bit length is 3, the minimum code length is $2^n$; if the information bit length is from 2 to n+1, the minimum code length is $2^{n-1}$; if the information bit length is from n+2 to 2n+1, the minimum code length is $(2^{n-1} - 2^{\lfloor(n+2)/2\rfloor-1})$.

A specific example is described to further explain a method for generating a linear block code. In the example, a method for generating 11 sequences of a linear block code with length of 32 is provided, i.e., n=5, K=11 and N=32.

In step 301, a first function $f_1(x)=x^5+x^2+1$ and a second function $f_2(x)=x^5+x^4+x^2+x^1+1$ are chosen. The two functions constitute an m-sequence pair of 5-order m-sequences.

All m-sequences generated according to $f_1(x)$ are as follows, where each row represents an m-sequence $m_i(t)$:

```
00001010111011000111110011010001
00010101110110001111100110100100
00011111001101001000010101110110
00100001010111011000111110011010
00101011101100011111001101000100
00110101000001010111011001000010
00111110011010010000101011101100
01000010101110110001111100110100
01000110001111001101001000010101
01010110001100011111001101001000
01011101100011111001101000100001
01100011111001101001000010101110
01101001000001010111011001000010
01110110001111100110101000010101
01111100110100100010101110110001
10000101011101100011111001101000
10001111100110100010000101101101
10010000101011101100011111100110
10011010010000010101101101000111
10100100001010111011000111111001
10101111011000111110011010010000
10110001111100110110010001010011
10111011000111110011010001000010
11000111110011010010000101011010
11001101001000010101110110001110
11010010000010101110101111011000
11011000111110011010001000010100
11100110100100001010111011000110
11100110001111001101010000001010
11101100110100000010100111011001
11111001101001000010101110110000
```

All m-sequences generated according to $f_2(x)$ are as follows, where each row represents an m-sequence $l_i(t)$:

```
00001101010010001011110110011110
00010111110110011110000110101001
00011010100100010111110110011110
```

-continued

```
0010001011111011001110000110101
0010111110110011100001101010010
0011010100100010111110110011100
0011100001101010010001011111011
0100010111110110011100001101010
0100100010111110110011100001101
0101001000101111101100111000011
0101111101100111000011010100100
0110011100001101010010001011111
0110101001000101111101100111000
0111000011010100100010111110110
```

-continued

```
0111110110011100001101010010001
1000011010100100010111110110011
1000101111101100111000011010100
1001000101111101100111000011010
1001110000110101001000101111101
1010010001011111011001110000110
1010100100010111110110011100001
1011001110000110101001000101111
1011111011001110000110101001000
1100001101010010001011111011001
1100111000011010100100010111110
1101010010001011111011001110000
1101100111000011010100100010111
1110000110101001000101111101100
1110110011100001101010010001011
1111011001110000110101001000101
1111101100111000011010100100010
```

In step 302, values of the $m_i(t)$ and $l_i(t)$ aforementioned are substituted into formulas (2) and (3) to obtain $C_1(i)=i$ and $Q_1(i)=i$, where $1 \leq i \leq 31$.

In step 303, because $C_1(i)=i$ and $Q_1(i)=i$, $m'_i(t)=m_i(t)$ and $l'_i(t)=l_i(t)$ can be obtained; that is, the obtained matrix made up of the third sequences is the same as the matrix made up of the first sequences; and the obtained matrix made up of the fourth sequences is the same as the matrix made up of the second sequences.

In step 304, there are many sequences of linear independence in the matrix made up of $m'_i(t)$, and $i\_1=1$, $i\_2=2$, $i\_3=4$, $i\_4=8$, $i\_5=16$ are chosen. This means the $1^{st}$, $2^{nd}$, $4^{th}$, $8^{th}$ and $16^{th}$ rows of the matrix of $m'_i(t)$ are chosen as the fifth sequences:

```
00001010111011000111110011010 01
00010101110110001111100110100 10
00110101011101100011111001101 01
01000101011101100011111001101 0
10000101011101100011111001101 00
```

The $1^{st}$, $2^{nd}$, $4^{th}$, $8^{th}$ and $16^{th}$ rows of the matrix of $l'_i(t)$ are chosen as the sixth sequences:

```
0000110101001000101111101100111
0001011111011001110000110101001
0010001011111011001110000110101
0100010111110110011100001101010
1000011010100100010111110110011
```

In step 305, the values of the fifth sequences are substituted into formula (6) to obtain the permutation function $C_2(t)$, which is shown in Table 4.

TABLE 4

| | Values of permutation function $C_2(t)$ | | | | | | | | | | | | | | | |
|---|---|---|---|---|---|---|---|---|---|---|---|---|---|---|---|---|
| t | 1 | 2 | 3 | 4 | 5 | 6 | 7 | 8 | 9 | 10 | 11 | 12 | 13 | 14 | 15 | 16 |
| $C_2(t)$ | 16 | 8 | 4 | 2 | 1 | 27 | 22 | 11 | 30 | 15 | 28 | 14 | 7 | 24 | 12 | 6 |
| t | 17 | 18 | 19 | 20 | 21 | 22 | 23 | 24 | 25 | 26 | 27 | 28 | 29 | 30 | 31 | |
| $C_2(t)$ | 3 | 26 | 13 | 29 | 21 | 17 | 19 | 18 | 9 | 31 | 20 | 10 | 5 | 25 | 23 | |

In step 306, for example, the permutation function C(t) is denoted as $C_2(t)$, the seventh sequences can be obtained as follows according to the values of the permutation function shown in Table 4 and formula (8):

```
10101010101010101010101010101 01
01100110011001100110011001100 11
00011110000111100001111000011 11
00000001111111100000000111111 11
00000000000000011111111111111 11
```

According to the values of the permutation function shown in Table 4 and formula (9), the eighth sequences can be obtained as follows:

```
10001100100001011110110001110 1
01101100101111011000110000101 0
00011000101100101011001111100 11
00100011011010001110111110100 10
00101000111001011100100011111 01
```

In step 307, add a "0" before each sequence of the seventh sequences and the eighth sequences to obtain 10 sequences with the length of 32. Then add an all-1 sequence with the length of 32 to obtain 11 sequences with the length of 32, which is shown as follows:

```
11111111111111111111111111111111
01010101010101010101010101010101
00110011001100110011001100110011
00001111000011110000111100001111
00000000111111110000000011111111
00000000000000001111111111111111
01000111001000010111101100011101
00110110010111110110001100001010
00000110001011001010110011111 0011
00001000110110100010101110011 0010
00010100011100101110010001111 101
```

These sequences described in step 307 make up an encoding matrix of linear block code, which is shown as follows:

$$\begin{bmatrix} 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 \\ 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 \\ 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 \\ 0 & 0 & 0 & 0 & 0 & 0 & 0 & 0 & 1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 \\ 0 & 0 & 0 & 0 & 0 & 0 & 0 & 0 & 0 & 0 & 0 & 0 & 0 & 0 & 0 & 0 & 1 & 1 & 1 & 1 & 1 & 1 & 1 & 1 & 1 & 1 & 1 & 1 & 1 & 1 & 1 & 1 \\ 0 & 1 & 0 & 0 & 0 & 1 & 1 & 1 & 0 & 0 & 1 & 0 & 0 & 0 & 0 & 1 & 0 & 1 & 1 & 1 & 1 & 0 & 1 & 1 & 0 & 0 & 0 & 1 & 1 & 1 & 0 & 1 \\ 0 & 0 & 1 & 1 & 0 & 1 & 1 & 0 & 0 & 1 & 0 & 1 & 1 & 1 & 1 & 0 & 1 & 1 & 0 & 0 & 0 & 1 & 1 & 0 & 0 & 0 & 0 & 1 & 0 & 1 & 0 \\ 0 & 0 & 0 & 0 & 1 & 1 & 0 & 0 & 0 & 1 & 0 & 1 & 1 & 0 & 0 & 1 & 0 & 1 & 0 & 1 & 1 & 0 & 0 & 1 & 1 & 1 & 1 & 0 & 0 & 1 & 1 \\ 0 & 0 & 0 & 1 & 0 & 0 & 0 & 1 & 1 & 0 & 1 & 1 & 0 & 1 & 0 & 0 & 0 & 1 & 1 & 1 & 0 & 1 & 1 & 1 & 1 & 0 & 1 & 0 & 0 & 1 & 0 \\ 0 & 0 & 0 & 1 & 0 & 1 & 0 & 0 & 0 & 1 & 1 & 1 & 0 & 0 & 1 & 0 & 1 & 1 & 1 & 0 & 0 & 1 & 0 & 0 & 0 & 1 & 1 & 1 & 1 & 1 & 0 & 1 \end{bmatrix}$$

A person skilled in the art would know that, in step 301, the n-order m-sequence generating functions $f_1(x)$ and $f_2(x)$ may have multiple options; in step 304, there may be also multiple options for choosing fifth sequences of linear independence and sixth sequences from the matrix made up of the third sequences and the matrix made up the fourth sequences. Therefore, the encoding matrix of linear block codes generated in the embodiment also has multiple possibilities where these the encoding matrix of linear block codes have the same features. These matrixes cannot be listed one by one here and the above (32, 11) encoding matrix is provided as an example. In a word, all other matrixes generated according to the method in the embodiment of the present disclosure and the preliminary transformation of these matrixes, including but not limited to row overlay, row exchange, column overlay, column exchange, row deletion or column deletion, are covered by the scope of the present disclosure.

erated have the same characteristics and are all extended codes of 1-order Reed Muller (RM) codes so that the radio telecommunication system can use Fast Hadamard Transform (FHT) to implement maximum likelihood decoding, which can decrease the complexity of decoding.

Figure 4:
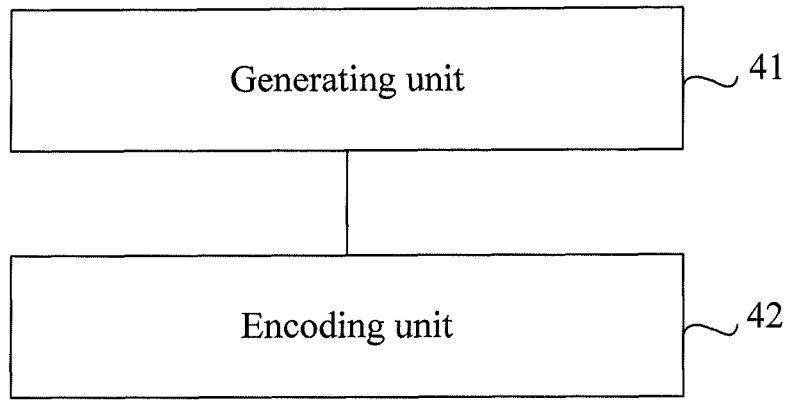
FIG. 4 shows a structure of a apparatus for encoding based on a linear block code according to further another embodiment of the present disclosure.

FIG. 4 shows a structure of an apparatus for encoding based on a linear block code according to further another embodiment of the present disclosure. As shown in FIG. 4, the apparatus includes a generating unit 41 and an encoding unit 42. The generating unit 41 generates linear block code and the encoding unit 42 encodes an information sequence with an encoding matrix of the linear block code to obtain a bit stream sequence.

For example, an encoding matrix of the linear block code generated by the generating unit 41 is as follows:

$$\begin{bmatrix} 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 \\ 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 \\ 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 \\ 0 & 0 & 0 & 0 & 0 & 0 & 0 & 0 & 1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 \\ 0 & 0 & 0 & 0 & 0 & 0 & 0 & 0 & 0 & 0 & 0 & 0 & 0 & 0 & 0 & 0 & 1 & 1 & 1 & 1 & 1 & 1 & 1 & 1 & 1 & 1 & 1 & 1 & 1 & 1 & 1 & 1 \\ 0 & 1 & 0 & 0 & 0 & 1 & 1 & 1 & 0 & 0 & 1 & 0 & 0 & 0 & 0 & 1 & 0 & 1 & 1 & 1 & 1 & 0 & 1 & 1 & 0 & 0 & 0 & 1 & 1 & 1 & 0 & 1 \\ 0 & 0 & 1 & 1 & 0 & 1 & 1 & 0 & 0 & 1 & 0 & 1 & 1 & 1 & 1 & 0 & 1 & 1 & 0 & 0 & 0 & 1 & 1 & 0 & 0 & 0 & 0 & 1 & 0 & 1 & 0 \\ 0 & 0 & 0 & 0 & 1 & 1 & 0 & 0 & 0 & 1 & 0 & 1 & 1 & 0 & 0 & 1 & 0 & 1 & 0 & 1 & 1 & 0 & 0 & 1 & 1 & 1 & 1 & 0 & 0 & 1 & 1 \\ 0 & 0 & 0 & 1 & 0 & 0 & 0 & 1 & 1 & 0 & 1 & 1 & 0 & 1 & 0 & 0 & 0 & 1 & 1 & 1 & 0 & 1 & 1 & 1 & 1 & 0 & 1 & 0 & 0 & 1 & 0 \\ 0 & 0 & 0 & 1 & 0 & 1 & 0 & 0 & 0 & 1 & 1 & 1 & 0 & 0 & 1 & 0 & 1 & 1 & 1 & 0 & 0 & 1 & 0 & 0 & 0 & 1 & 1 & 1 & 1 & 1 & 0 & 1 \end{bmatrix}$$

It should be noted that the above example provides the linear block codes generated when n=5, but the embodiment of the present disclosure may provide not only 11 sequences with the length of 32 but also more than 11 sequences longer than 32 and fewer than 11 sequences shorter than 32. Therefore, the linear block codes generated in the embodiment are able to meet the diversified requirements in a radio telecommunication system.

The embodiment provides a method for generating a linear block code, which can be used in a radio telecommunication system. The method is a systematic construction method, which is able to generate any number of linear block codes corresponding to any length of information sequences, so that the radio telecommunication system is able to encode an information sequence of any length to obtain a bit stream sequence with an corresponding length. The minimum distance of these linear block codes is better than that of the prior art, so that the error correction performance of the encoding system is improved. Furthermore, the linear block codes gen- The encoding unit 42 may encode the information sequence according to formula (1) to obtain a bit stream sequence. The encoding unit 42 performs encoding with the above encoding matrix, so that the error correction performance will be improved.

Figure 5:
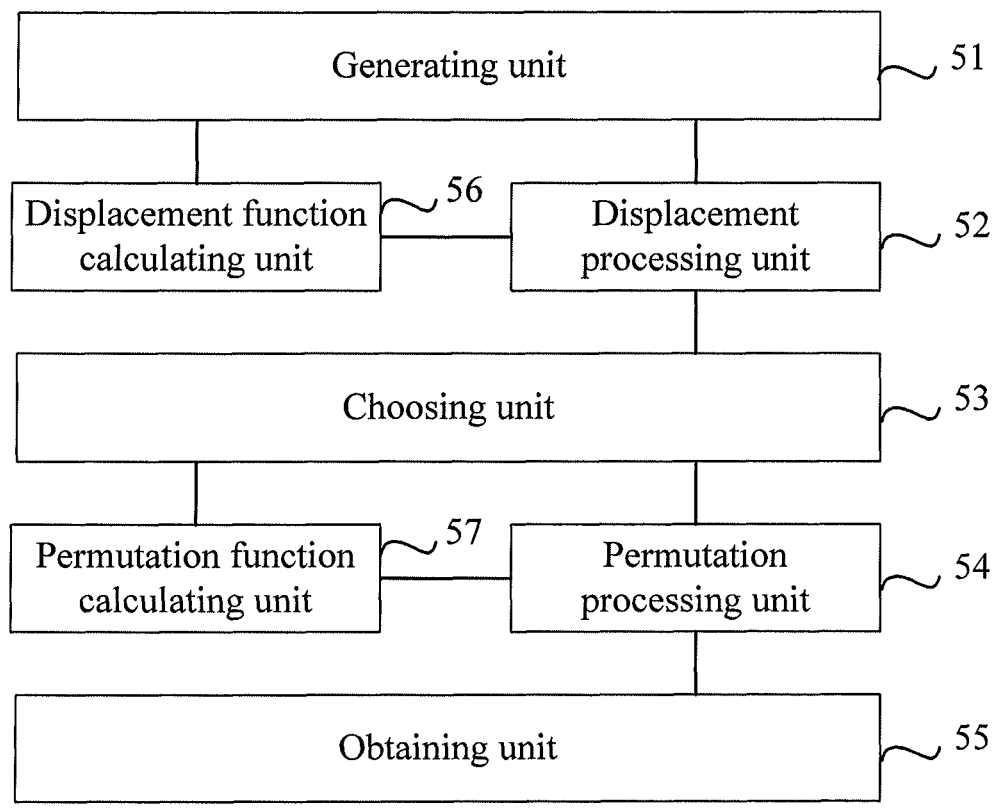
FIG. 5 shows a structure of apparatus for generating a linear block code according to further another embodiment of the present disclosure.

FIG. 5 shows a structure of an apparatus for generating a linear block code according to further another embodiment of the present disclosure. As shown in FIG. 5, the apparatus includes a generating unit 51, a displacement processing unit 52, a choosing unit 53, a permutation processing unit 54 and an obtaining unit 55.

The generating unit 51 generates all first sequences and second sequences according to a first function and a second function, respectively. The displacement processing unit 52 displaces rows of a matrix made up of the first sequences and rows of a matrix made up of the second sequences, respectively, to obtain a matrix made up of third sequences and a matrix made up of fourth sequences. The choosing unit 53 chooses multiple fifth sequences of linear independence from the matrix made up of the third sequences and multiple sixth sequences of linear independence from the matrix made up of the fourth sequences. The permutation processing unit 54 permutes columns of the matrix made up of the fifth sequences and columns of the matrix made up of the sixth sequences to obtain a matrix made up of seventh sequences and a matrix made up of eighth sequences. And the obtaining unit 55 obtains an encoding matrix of a linear block code according to the matrix made up of the seventh sequences and the matrix made up of the eighth sequences.

Further, the apparatus may further include a displacement function calculating unit 56, which is configured to calculate a first displacement function and a second displacement function according to the first sequences and the second sequences, respectively. Therefore, the displacement processing unit 52 is specifically configured to displace the rows of the matrix made up of the first sequences according to the first displacement function to obtain a matrix made up of third sequences; and configured to displace the rows of the matrix made up of the second sequences according to the second displacement function to obtain a matrix made up of fourth sequences.

The apparatus in the embodiment may further include a permutation function calculating unit 57, which is configured to calculate a permutation function according to the fifth or sixth sequences. Therefore, the permutation processing unit 54 is specifically configured to permute the columns of the matrix made up of the fifth sequences according to the permutation function to obtain a matrix made up of seventh sequences; and configured to permute the columns of the matrix made up of the sixth sequences according to the permutation function to obtain a matrix made up of eighth sequences.

The embodiment provides an apparatus for generating a linear block code, which can be used in a radio telecommunication system. The apparatus is able to generate any number of linear block codes corresponding to any length of information sequences, so that the radio telecommunication system is able to encode an information sequence of any length to obtain code stream sequences with a corresponding length. The minimum distance of these linear block codes is better than that of the prior art, so that the error correction performance of the encoding system is improved. Furthermore, the linear block codes generated have the same characteristics and are all extended codes of 1-order RM codes so that the radio telecommunication system can use FHT to implement maximum likelihood decoding, which can deduce the complexity of decoding.

The methods and apparatuses provided in embodiments of the present disclosure are also applicable in a WCDMA or a LTE system. Further, in later evolution systems, such as LTE+, linear block codes generated according to the embodiments of the present disclosure or their equivalents (including row exchange, column exchange, row overlay, column overlay or punching) may also be used for encoding. Therefore, the embodiments of the present disclosure are also applicable in similar later evolution systems.

It is understandable to those skilled in the art that all or part of the steps of the foregoing embodiments may be implemented by hardware, such as a processor or processors, instructed by a program. The program may be stored in a computer-readable storage medium. When being executed, the program performs the steps of the foregoing method embodiments. The storage medium may be any medium capable of storing program codes, for example, a Read-Only Memory (ROM), a Random Access Memory (RAM), a magnetic disk, and a compact disk.

Although the technical solution of the present disclosure has been described through exemplary embodiments, the disclosure is not limited to such embodiments. It is apparent that those skilled in the art can make various modifications and variations to the disclosure without departing from the spirit and scope of the present disclosure. The disclosure is intended to cover the modifications and variations provided that they fall in the scope of protection defined by the claims or their equivalents.

What is claimed is:

1. A non-transitory computer program product for generating a linear block code, the computer program product comprising a computer-readable storage medium having a set of instructions stored thereon, the set of instructions being executable by one or more processors to perform functions in a radio telecommunication system, comprising:

generating all first sequence and second sequence according to a first function and a second function, respectively; wherein the first and the second sequences generated by the first and the second functions constitute an m-sequence pair;

displacing rows of a matrix formed by the first sequence and rows of a matrix which is formed by the second sequence, respectively, in order to obtain a matrix which is formed by third sequence and a matrix which is formed by fourth sequence;

choosing multiple fifth sequences of linear independence from the matrix which is formed by the third sequence and choosing multiple sixth sequences of linear independence from the matrix which is formed by the fourth sequence;

permuting columns of the matrix which is formed by the fifth sequence and columns of the matrix which is formed by the sixth sequences in order to obtain a matrix which is formed by seventh sequence and a matrix which is formed by eighth sequence; and obtaining an encoding matrix of a linear block code according to the matrix which is formed by the seventh sequence and the matrix which is formed by the eighth sequence, wherein the encoding matrix of the linear block code is used for encoding an information sequence, comprises the following:

$$\begin{bmatrix} 1 & 1 & 1 & 1 & 1 & 1 & 1 & 1 & 1 & 1 & 1 & 1 & 1 & 1 & 1 & 1 & 1 & 1 & 1 & 1 \\ 0 & 1 & 0 & 1 & 0 & 1 & 0 & 1 & 0 & 1 & 0 & 1 & 0 & 1 & 0 & 1 & 0 & 1 & 0 & 1 \\ 0 & 0 & 1 & 1 & 0 & 0 & 1 & 1 & 0 & 0 & 1 & 1 & 0 & 0 & 1 & 1 & 0 & 0 & 1 & 1 & 0 & 0 \\ 0 & 0 & 0 & 0 & 1 & 1 & 1 & 1 & 0 & 0 & 0 & 0 & 1 & 1 & 1 & 1 & 0 & 0 & 0 & 0 & 1 & 1 \\ 0 & 0 & 0 & 0 & 0 & 0 & 0 & 0 & 1 & 1 & 1 & 1 & 1 & 1 & 1 & 1 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 & 1 & 1 & 1 & 1 & 1 & 1 \\ 0 & 1 & 0 & 0 & 0 & 1 & 1 & 1 & 0 & 0 & 1 & 0 & 0 & 0 & 0 & 1 & 0 & 1 & 1 & 1 & 1 & 0 \\ 0 & 0 & 1 & 1 & 0 & 1 & 1 & 0 & 0 & 1 & 0 & 1 & 1 & 1 & 1 & 0 & 1 & 1 & 0 & 0 & 0 \\ 0 & 0 & 0 & 0 & 1 & 1 & 0 & 0 & 0 & 1 & 0 & 1 & 1 & 0 & 0 & 1 & 0 & 1 & 0 & 1 & 1 & 0 \\ 0 & 0 & 0 & 1 & 0 & 0 & 0 & 1 & 1 & 0 & 1 & 1 & 0 & 1 & 0 & 0 & 0 & 1 & 1 & 1 & 0 & 1 \\ 0 & 0 & 0 & 1 & 0 & 1 & 0 & 0 & 0 & 1 & 1 & 1 & 0 & 0 & 1 & 0 & 1 & 1 & 1 & 0 & 0 & 1 \end{bmatrix}$$

$$\begin{bmatrix} 1 & 1 & 1 & 1 & 1 & 1 & 1 & 1 & 1 & 1 \\ 0 & 1 & 0 & 1 & 0 & 1 & 0 & 1 & 0 & 1 \\ 1 & 1 & 0 & 0 & 1 & 1 & 0 & 0 & 1 & 1 \\ 1 & 1 & 0 & 0 & 0 & 0 & 1 & 1 & 1 & 1 \\ 0 & 0 & 1 & 1 & 1 & 1 & 1 & 1 & 1 & 1 \\ 1 & 1 & 1 & 1 & 1 & 1 & 1 & 1 & 1 & 1 \\ 1 & 1 & 0 & 0 & 0 & 1 & 1 & 1 & 0 & 1 \\ 1 & 1 & 0 & 0 & 0 & 0 & 1 & 0 & 1 & 0 \\ 0 & 1 & 1 & 1 & 1 & 1 & 0 & 0 & 1 & 1 \\ 1 & 1 & 1 & 1 & 0 & 1 & 0 & 0 & 1 & 0 \\ 0 & 0 & 0 & 1 & 1 & 1 & 1 & 1 & 0 & 1 \end{bmatrix}.$$

2. The non-transitory computer program product according to claim 1, further performing functions, comprising:
calculating a first displacement function and a second displacement function according to the first sequence and the second sequence, respectively, wherein the displacing process comprising:
displacing the rows of the matrix made up of the first sequences according to the first displacement function to obtain a matrix which is formed by the third sequence; and
displacing the rows of the matrix which is formed by the second sequence according to the second displacement function, in order to obtain the matrix which is formed by the fourth sequence.

3. The non-transitory computer program product according to claim 1, further performing functions, comprising:
calculating a permutation function according to the fifth or the sixth sequence, wherein the permuting process comprising:
permuting the columns of the matrix which is formed by the fifth sequence according to the permutation function in order to obtain a matrix which is formed by the seventh sequence; and permuting the columns of the matrix which is formed by the sixth sequence according to the permutation function in order to obtain a matrix which is formed by the eighth sequence.

4. The non-transitory computer program product according to claim 1, wherein the first sequence and the second sequence form portions of the m-sequences.

5. The non-transitory computer program product according to claim 1, wherein the positions of the fifth sequence in a matrix which is formed by the third sequence has same position as the sixth sequence in the matrix which is formed by the fourth sequence.

6. The non-transitory computer program product according to claim 1, wherein the radio telecommunication system comprises one or more of: WCDMA, long term evolution (LTE) system, and LTE+.

7. The non-transitory computer program product according to claim 1, wherein the linear block codes generated comprises characteristics pertaining to 1-order Reed Muller (RM) codes.

8. The non-transitory computer program product according to claim 1, comprising utilizing Fast Hadamard Transform (FHT) for implementing maximum likelihood decoding to decrease decoding complexity.

\* \* \* \* \*